(12) United States Patent
Enriquez Shibayama et al.

(10) Patent No.: US 11,990,709 B2
(45) Date of Patent: May 21, 2024

(54) HIGH SPEED DIFFERENTIAL PINOUT ARRANGEMENT INCLUDING A POWER PIN

(71) Applicant: Intel Corporation, Santa Clara, CA (US)

(72) Inventors: Raul Enriquez Shibayama, Zapopan (MX); Carlos Alberto Lizalde Moreno, Guadalajara (MX); Gaudencio Hernandez Sosa, Guadalajara (MX); Kai Xiao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 820 days.

(21) Appl. No.: 16/902,832

(22) Filed: Jun. 16, 2020

(65) Prior Publication Data

US 2021/0391671 A1    Dec. 16, 2021

(51) Int. Cl.
*H01R 13/00* (2006.01)
*H01R 12/71* (2011.01)
*H01R 13/6469* (2011.01)
*H01R 13/6471* (2011.01)
*H05K 7/14* (2006.01)

(52) U.S. Cl.
CPC ....... *H01R 13/6469* (2013.01); *H01R 12/718* (2013.01); *H01R 13/6471* (2013.01); *H05K 7/1452* (2013.01)

(58) Field of Classification Search
CPC .............. H01R 13/6469; H01R 12/718; H01R 13/6471; H05K 7/1452
See application file for complete search history.

(56) References Cited

U.S. PATENT DOCUMENTS

| | | | |
|---|---|---|---|
| 7,255,573 B2 | 8/2007 | He et al. | |
| 10,038,281 B2 | 7/2018 | Wig | |
| 10,522,949 B1 * | 12/2019 | Loffink | H01R 13/6471 |
| 2014/0140027 A1 | 5/2014 | Shibayama et al. | |
| 2020/0083155 A1 | 3/2020 | Shibayama et al. | |

* cited by examiner

*Primary Examiner* — Phuong Chi Thi Nguyen
(74) *Attorney, Agent, or Firm* — Akona IP PC

(57) ABSTRACT

Microelectronic assemblies, as well as related structures, devices, and methods, are disclosed herein. For example, in some embodiments, a microelectronic assembly may include a microelectronic device having a hexagonal node configuration, wherein the hexagonal node configuration may include a differential signal node pair; a power node; and a plurality of ground nodes; and wherein the differential signal node pair, the power node, and the plurality of ground nodes are arranged in a hexagonal parallelogon pattern, wherein the differential signal node pair includes a first differential signal node adjacent to a second differential signal node, and wherein the power node is adjacent and symmetric to the differential signal node pair; and a microelectronic substrate electrically coupled to the microelectronic device.

20 Claims, 13 Drawing Sheets

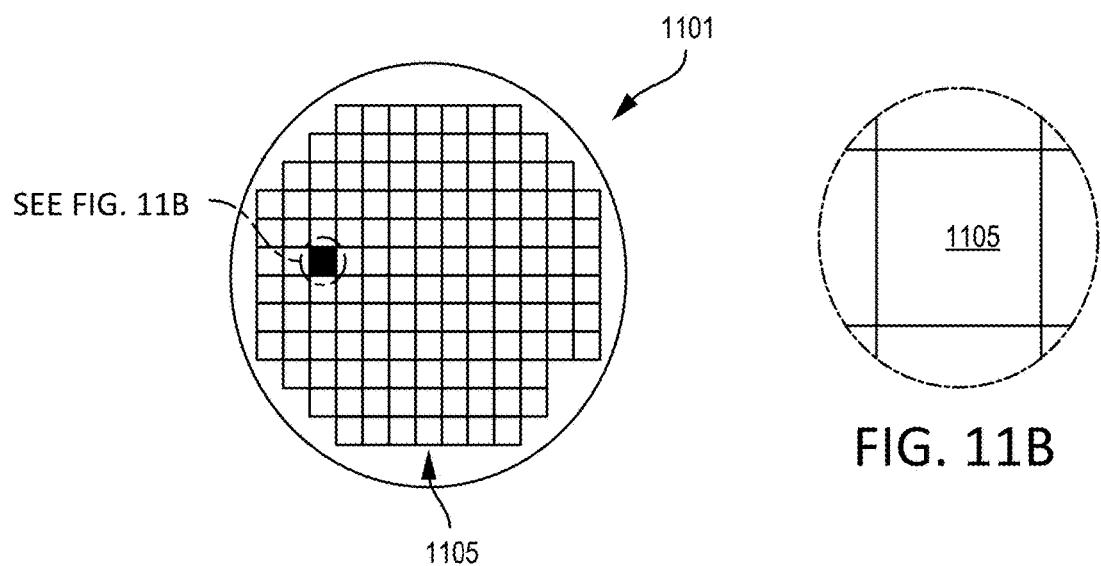
FIG. 11A
FIG. 11B
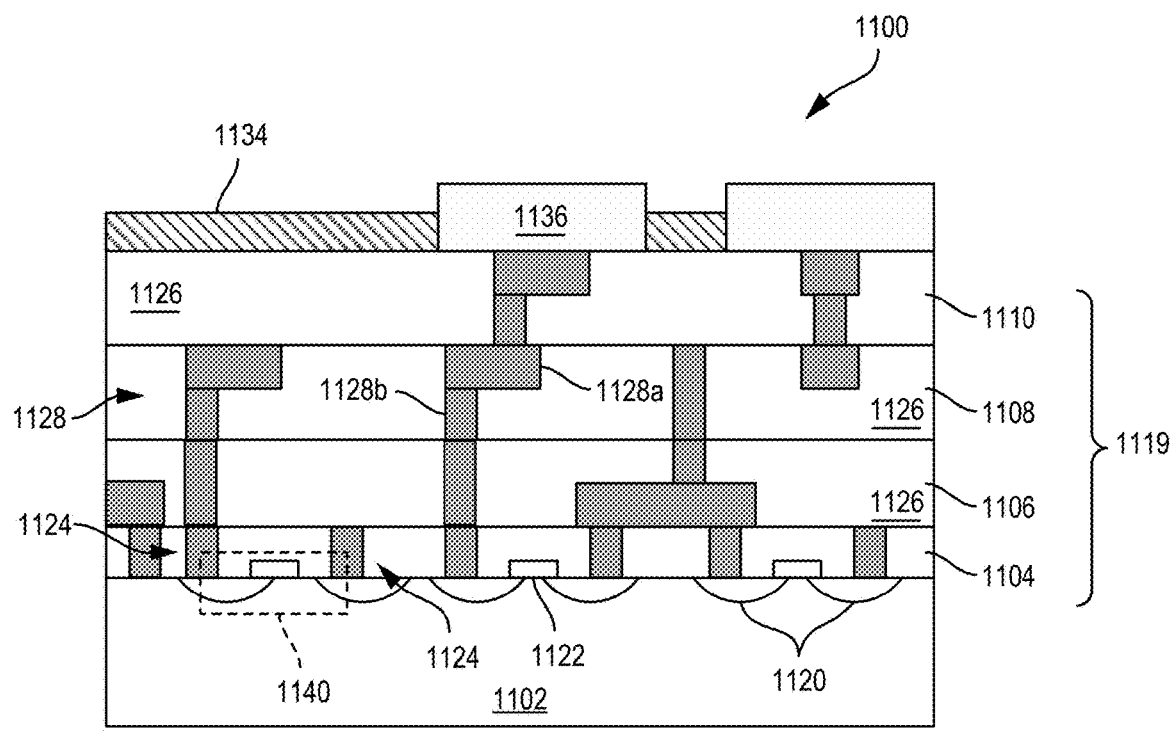
FIG. 11C

HIGH SPEED DIFFERENTIAL PINOUT ARRANGEMENT INCLUDING A POWER PIN

BACKGROUND

Integrated circuit (IC) devices are routinely connected to and communicate with other IC devices via a large number of electrical interconnects that carry high speed signals. The electrical interconnects are in close proximity and commonly experience signal crosstalk and other interference, which degrades the signal integrity and causes an error in the received signal.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 11A and 11B are top views of a wafer and dies that may be used with any of the embodiments of the IC packages disclosed herein.

FIG. 11C is a cross-sectional side view of an IC device that may be used with any of the embodiments of the electrical interconnects disclosed herein.

DETAILED DESCRIPTION

Figure 1:
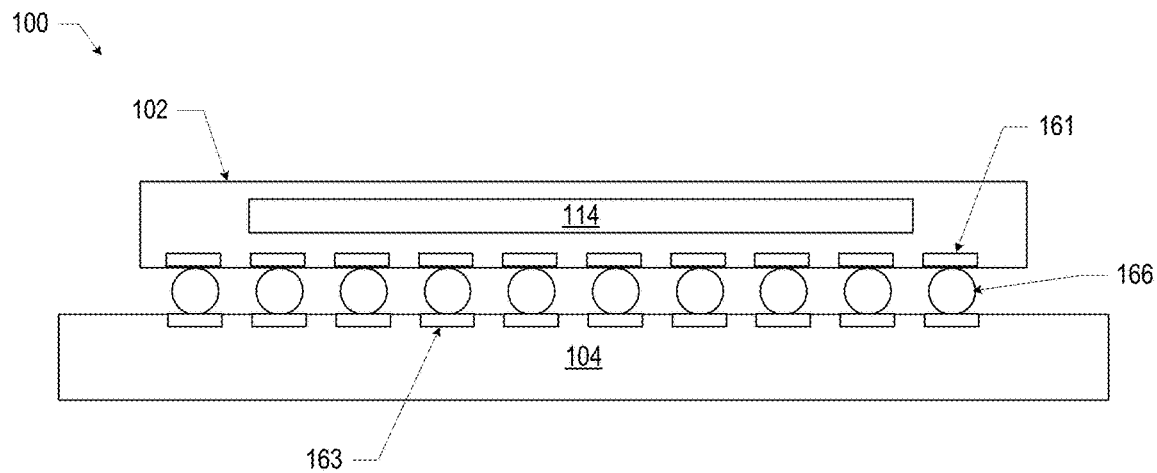
FIG. 1 is a side, cross-sectional view of a microelectronic assembly, in accordance with various embodiments.

Microelectronic assemblies, as well as related structures, devices, and methods, are disclosed herein. For example, in some embodiments, a microelectronic assembly may include a microelectronic device having a hexagonal node configuration, wherein the hexagonal node configuration may include a differential signal node pair; a power node; and a plurality of ground nodes; and wherein the differential signal node pair, the power node, and the plurality of ground nodes are arranged in a hexagonal parallelogon pattern, wherein the differential signal node pair includes a first differential signal node adjacent to a second differential signal node, and wherein the power node is adjacent and symmetric to the differential signal node pair; and a microelectronic substrate electrically coupled to the microelectronic device.

Electrically conductive interconnects couple integrated circuitry of two or more devices, for example, a die to a motherboard (also referred to as a circuit board herein), a printed circuit board (PCB) to another PCB, or a die to a silicon package. The electrically conductive interconnects, which are positioned in close proximity, may cause crosstalk due to electric and magnetic field interference among adjacent interconnects or may cause crosstalk by acting as unintentional and inefficient transmit and receive antennas. For example, high speed differential signal pins require two pins (e.g., a differential signal pair) positioned in close proximity, which may cause crosstalk due to the number of differential signal pins and to the speed of the signals. A conventional approach for lessen crosstalk in differential signal systems includes surrounding the pair of differential signal pins with ground pins to isolate the pair of differential signal pins. This conventional approach increases the number of ground pins per differential signal pair that are required to reduce crosstalk, increases the size of an interconnect area, and reduces the real estate available to other pins, such as power pins. Not only is this conventional approach costly, but also, may cause mechanical instability and is incompatible with fine pitch packages.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. Common elements in different figures may be identified with a common label.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used to describe a range of dimensions, the phrase "between X and V" represents a range that includes X and Y. For convenience, the phrase "FIG. 2" may be used to refer to the collection of drawings of FIGS. 2A-2D, etc. Although certain elements may be referred to in the singular herein, such elements may include multiple sub-elements.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

FIG. 1 is a side, cross-sectional view of a microelectronic assembly 100 including a microelectronic device 102 coupled to a microelectronic substrate 104. As shown in FIG. 1, the microelectronic device 102 is coupled to a microelectronic substrate 104 by solder bumps of a ball grid array (BGA). In the production of microelectronic assemblies, microelectronic devices are generally mounted on microelectronic substrates, which provide electrical communication routes between the microelectronic devices and external components. As shown in FIG. 1, a microelectronic assembly 100 may comprise a microelectronic device 102 attached to a microelectronic substrate 104. The microelectronic device 102 may be any suitable IC device, such as a packaged microelectronic die 114 (e.g. a microprocessor, a chipset, a graphics device, a wireless device, a memory device, an application specific integrated circuit, or the like), and may be a bare microelectronic die. The microelectronic die 114 may be packaged in any manner known in the art. The microelectronic substrate 104 may be any suitable substrate, such as an interposer, a printed circuit board, and the like, and may be primarily composed of any suitable material, including, but not limited to, bismaleimine triazine resin, fire retardant grade 4 material, polyimide materials, glass reinforced epoxy matrix material, and the like, as well as laminates or multiple layers thereof. It is understood that the microelectronic device 102 may be another microelectronic substrate, such as described for the microelectronic substrate 104 or any other appropriate device for attachment to the microelectronic substrate 104. The microelectronic device 102 may include a plurality of conductive contact pads 161 on a surface facing the microelectronic substrate 104, and the microelectronic substrate 104 may include a plurality of conductive contact pads 163 on a surface facing the microelectronic device 102. The microelectronic device 102 may be mechanically attached and electrically coupled to the microelectronic substrate 104 through a plurality of solder bump interconnects 166 extending between the conductive contact pads 161 on the microelectronic device 102 and the conductive contact pads 163 on the microelectronic substrate 104. The solder bump interconnects 166 may be made of any suitable material, including but not limited to lead/tin alloys, such as tin/lead solder, such as 63% tin/37% lead solder, or lead-free solders, for example, pure tin or high tin content alloys (e.g. 90% or more tin), such as tin/bismuth, eutectic tin/silver, ternary tin/silver/copper, eutectic tin/copper, and similar alloys. When the microelectronic device 102 is attached to the microelectronic substrate 104, the solder bump interconnects 166 may be reflowed, either by heat, pressure, and/or sonic energy to secure the solder bump interconnects 166 between the respective the conductive contact pads 161 on the microelectronic device 102 and the conductive contact pads 163 on the microelectronic substrate 104. The microelectronic device 102 and the microelectronic substrate 104 may be in communication with each other and with other components via the solder bump interconnects 166 and via conductive pathways (not shown), including conductive traces and vias, in the microelectronic device 102 and in the microelectronic substrate. Although FIG. 1 illustrates solder balls in a BGA package, the pinout configurations described herein may be applied to a pogo pin package and a socket pin package, for example, a pin grid array (PGA) socket and a land grid array (LGA) socket. A pogo pin package or a socket pin package may include spring-loaded probes, stamped pins, elastomer pins, etching formed pins, and wired pins, to provide electrical coupling. An interconnect generally is a conductive element that connects two or more devices electrically for transmitting data. Typically, an interconnect couples two or more devices via conductive contacts on the surfaces of the devices. Any of the conductive contacts and interconnects disclosed herein (e.g., the conductive contact pads 161, 163 and the solder bump interconnects 166) may be arranged according to any of the exemplary pin field configurations 200 of FIG. 2. An electrical interconnect may also be referred to herein as "interconnect", "interconnect pin", or "pin."

Most high-speed digital signals include differential signal pairs. A differential signal pair consists of two separate interconnects (e.g., the solder bump interconnects 166 of FIG. 1) transmitting the same electrical signal but of a different polarity (i.e. a first interconnect of the pair transmits a positive polarity and a second interconnect of the pair transmits a negative polarity). The differential signal transmitted is the voltage difference between the two interconnects.

Figure 2A:
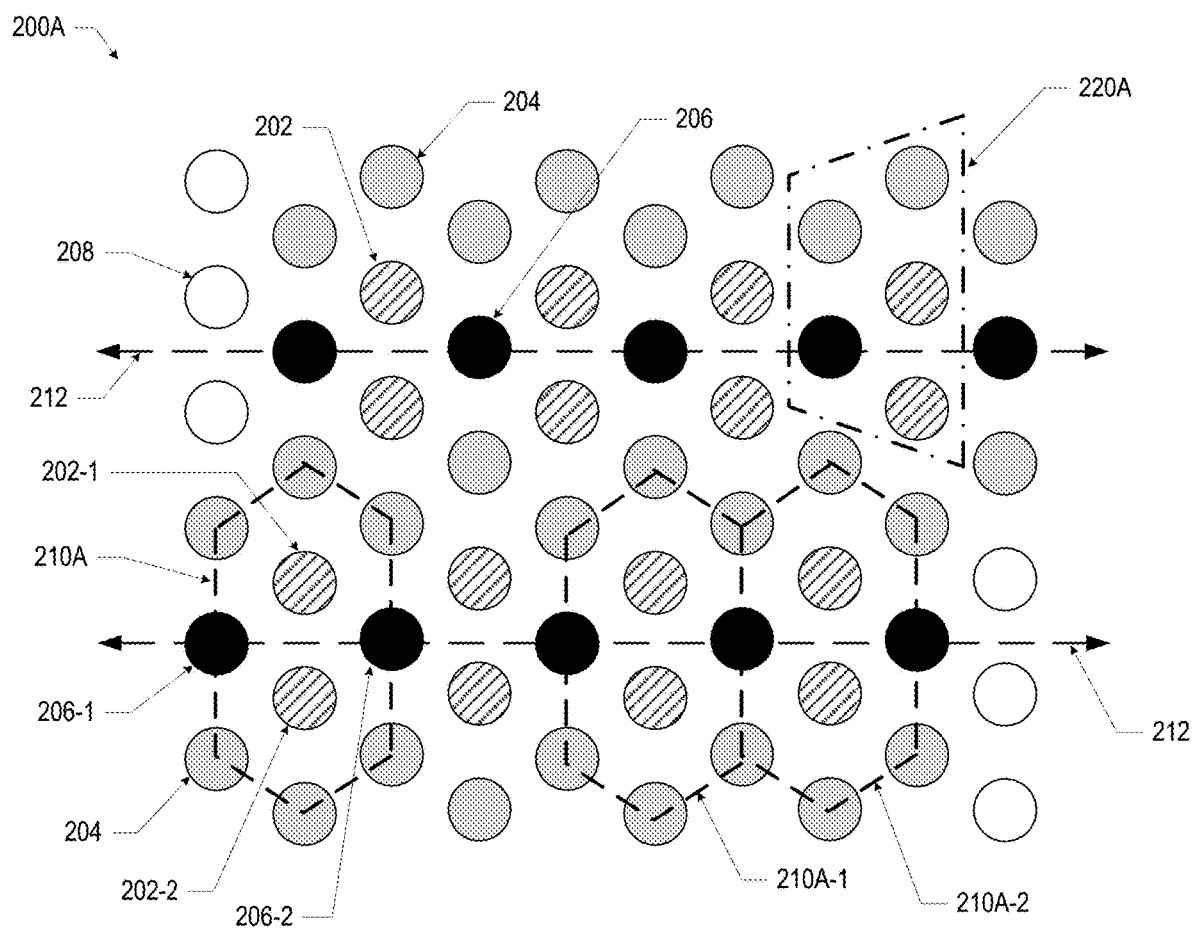
FIG. 2A is a top view of a portion of an exemplary hexagonal parallelogon pin field configuration including high speed differential pins and power pins, in accordance with various embodiments.

FIG. 2A is a top view of a portion of an exemplary hexagonal parallelogon pin field configuration, in accordance with various embodiments. The exemplary pin field configuration 200A includes a plurality of high speed differential pin pairs 202 (i.e., as indicated by the diagonally-striped circles), a plurality of ground pins 204 (i.e., as indicated by the light gray circles), and a plurality of power pins 206 (i.e., as indicated by the black circles) arranged in a hexagonal parallelogon pattern 210A (i.e., as indicated by the dotted line forming an elongated parallelogram). As shown in FIG. 2A, the grid array may have a hexagonal arrangement (i.e., an individual interconnect pin has six adjacent interconnect pins) to fit a maximum number of interconnect pins within a minimum distance from adjacent interconnect pins. Further, as shown in FIG. 2A, the differential pairs may be arranged to align horizontally (e.g., along a horizontal line). As used herein, a hexagonal parallelogon, also referred to herein as an elongated parallelogram, is a six-sided polygon with parallel opposite sides of equal length, where one pair of opposite sides is longer than the others. The high speed differential pin pair 202-1, 202-2 are positioned adjacent to each other and a zero-voltage line 212 is formed between the differential pin pair 202-1, 202-2. The power pin 206 may be any suitable power pin, including a digital power pin (e.g., a core power rail, and a system agent power rail) and an analog power pin (e.g., a Peripheral Component Interconnect Express (PCIe) power rail, a Double Data Rate (DDR) power rail, an Intel® Ultra Path Interconnect® (UPI) power rail, and a Phase Locked Loop (PLL) power rail). The power pins 206 are positioned adjacent to the differential signal pins 202 at the zero-voltage line 212, and the ground pins 204 are positioned adjacent to the differential signal pins 202 above and below the zero-voltage line 212. The zero-voltage line 212, also referred to herein as the zero-crosstalk line, is a characteristic of differential pairs. When an interconnect that is likely to be disruptive to signal quality is positioned symmetrical to the differential pair (i.e., along the zero-voltage line) the disruption and crosstalk may be minimized. As shown in FIG. 2, in a hexagonal configuration, each differential signal pair has two adjacent symmetrical positions (i.e., power pins 206-1, 206-2). A grid array may repeat the hexagonal parallelogon pattern (e.g., 210A-1, 210A-2) with adjacent differential signal pairs 202 sharing the adjacent power pins 206 and ground pins 204. The hexagonal parallelogon pattern of FIG. 2A in its simplest form (as indicated by the dashed and dotted line 220A) has a signal/power pin to ground pin ratio equal to 3:2. In some embodiments, the power pins 206 may be exchanged for miscellaneous pins. Examples of miscellaneous pins include reset signal pins, security signal pins, chip selection pins, flag signal pins, and platform state indicator pins, among others. When miscellaneous pins replace the power pins, the hexagonal parallelogon pattern of FIG. 2A has a signal/miscellaneous pin to ground pin ratio of 3:2. The exemplary pin field configuration 200A may further include other interconnect pins 208 (i.e., as indicated by the white circles) positioned along one or more edges. Other interconnect pins 208 may include, for example, sideband pins, power pins, ground pins, and high-speed signal pins.

Figure 2B:
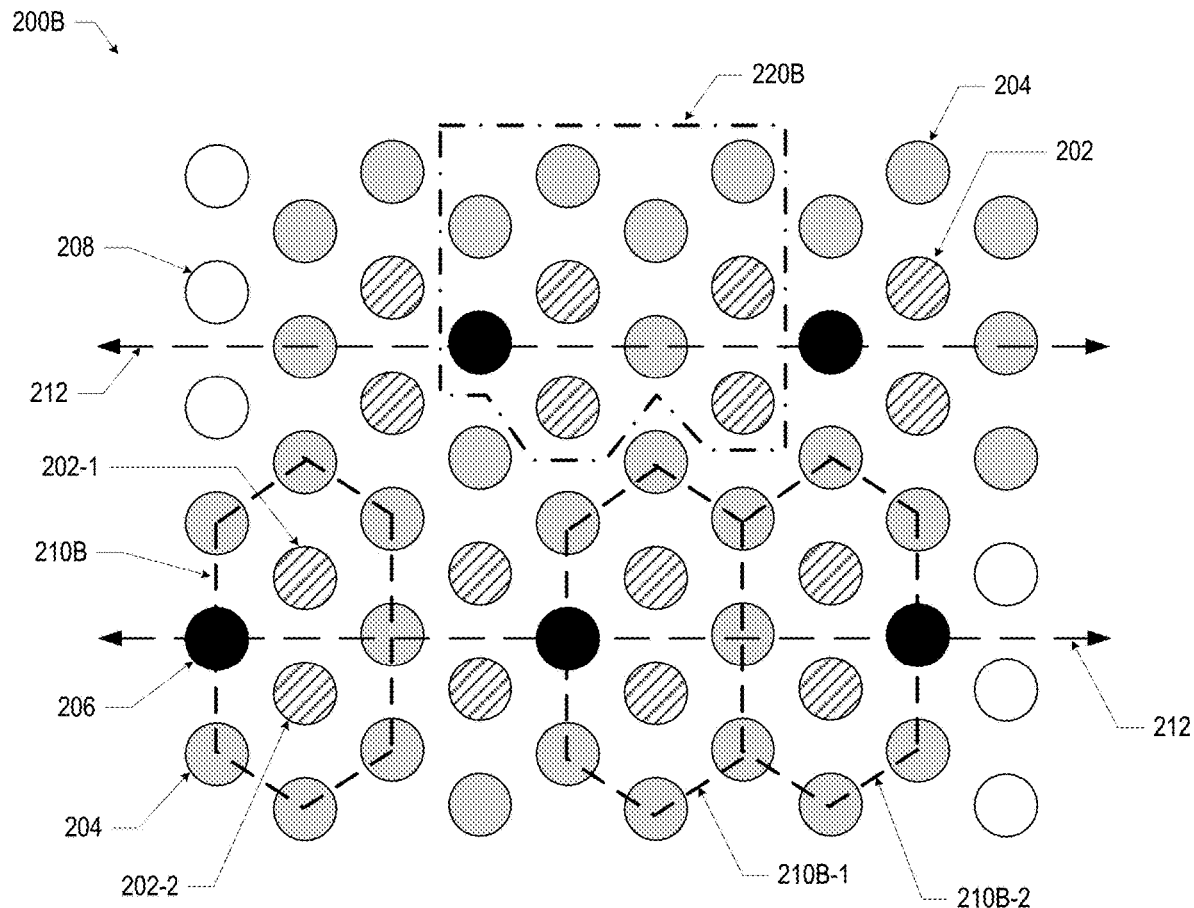
FIG. 2B is a top view of a portion of another exemplary hexagonal parallelogon pin field configuration including high speed differential pins and power pins, in accordance with various embodiments.

FIG. 2B is a top view of a portion of another exemplary hexagonal parallelogon pin field configuration, in accordance with various embodiments. The exemplary pin field configuration 200B includes a plurality of high speed differential pin pairs 202 (i.e., as indicated by the diagonally-striped circles), a plurality of ground pins 204 (i.e., as indicated by the light gray circles), and a plurality of power pins 206 (i.e., as indicated by the black circles) arranged in a hexagonal parallelogon pattern 210B (i.e., as indicated by the dotted line forming an elongated parallelogram). As shown in FIG. 2B, the differential pairs are arranged to align horizontally. The high speed differential pin pair 202-1, 202-2 are positioned adjacent to each other and a zero-voltage line 212 is formed between the differential pin pair 202-1, 202-2. One power pin 206 is positioned adjacent and symmetric to the differential signal pins 202 at the zero-voltage line 212 on a first side, one ground pin 204 is positioned adjacent and symmetric to the differential signal pins 202 at the zero-voltage line 212 on a second side opposite the first side, and six ground pins 204 are positioned adjacent to the differential signal pins 202 above and below the zero-voltage line 212. A grid array may repeat the hexagonal parallelogon pattern (e.g., 210B-1, 210B-2) with adjacent differential signal pairs 202 sharing the adjacent power pins 206 and ground pins 204. The hexagonal parallelogon pattern of FIG. 2B in its simplest form (as indicated by the dashed and dotted line 220B) has a signal/power pin to ground pin ratio equal to 5:5 (i.e., 1:1). In some embodiments, the power pins 206 may be exchanged for miscellaneous pins, as described above with reference to FIG. 2A. When miscellaneous pins replace the power pins, the hexagonal parallelogon pattern of FIG. 2B has a signal/miscellaneous pin to ground pin ratio of 5:5 or 1:1.

Figure 2C:
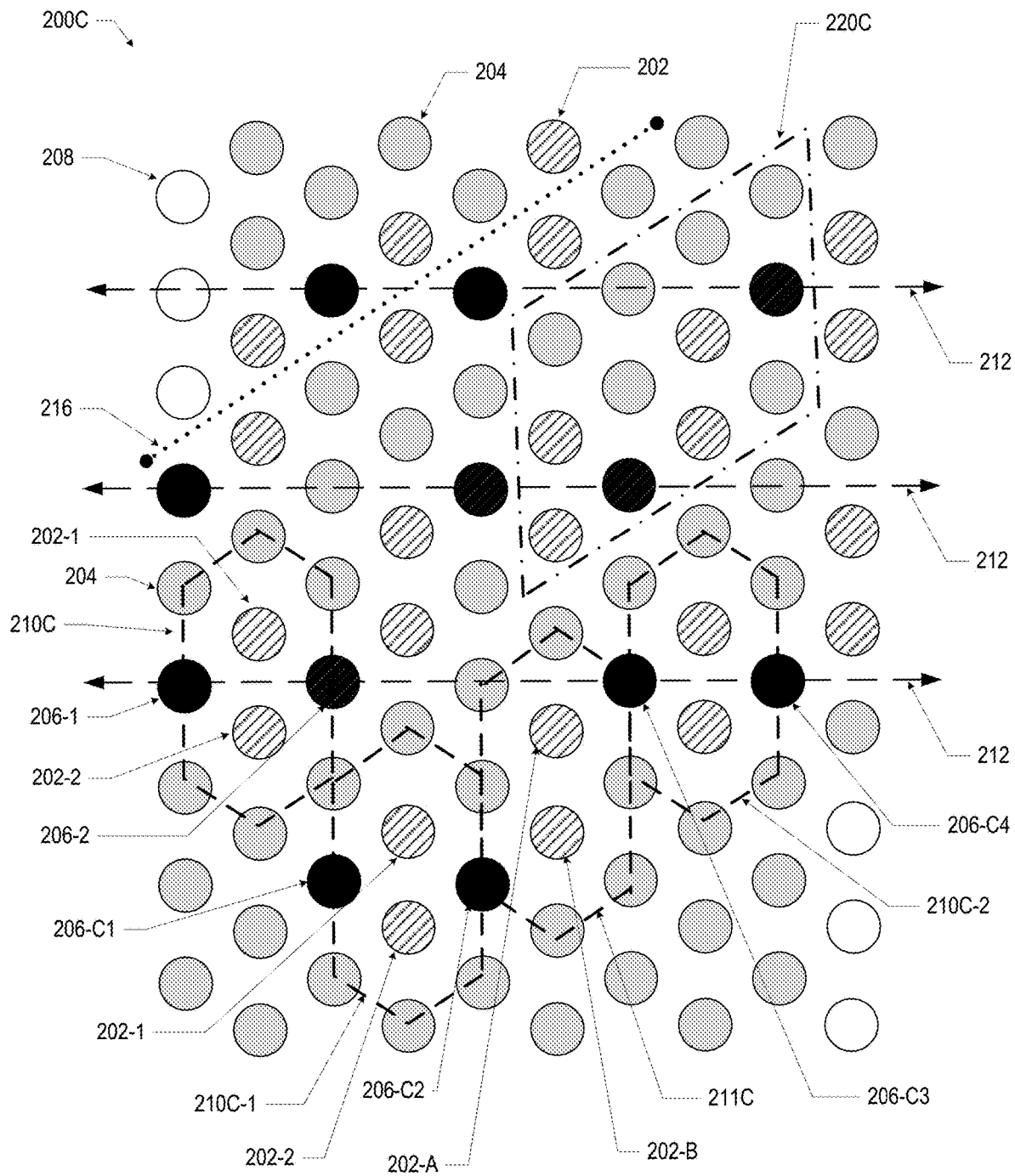
FIG. 2C is a top view of a portion of another exemplary hexagonal parallelogon pin field configuration including high speed differential pins and power pins, in accordance with various embodiments.

FIG. 2C is a top view of a portion of another exemplary hexagonal parallelogon pin field configuration, in accordance with various embodiments. The exemplary pin field configuration 200C includes a plurality of high speed differential pin pairs 202 (i.e., as indicated by the diagonally-striped circles), a plurality of ground pins 204 (i.e., as indicated by the light gray circles), and a plurality of power pins 206 (i.e., as indicated by the black circles) arranged in a hexagonal parallelogon pattern 210C (i.e., as indicated by the dotted line forming an elongated parallelogram). The differential pairs are arranged in an offset pattern, where the differential pairs align diagonally (e.g., dashed line 216) rather than horizontally (e.g., for a hexagonal node configuration the differential pairs align along a 60 degrees diagonal line). The high speed differential pin pair 202-1, 202-2 are positioned adjacent to each other and a zero-voltage line 212 is formed between the differential pin pair 202-1, 202-2. For clarity, not all zero-voltage lines 212 are depicted in FIG. 2C. For a first differential pair, the power pins 206-1, 206-2 are positioned adjacent to the differential signal pins 202-1, 202-2 at the zero-voltage line 212, and the ground pins 204 are positioned adjacent to the differential signal pins 202-1, 202-2 above and below the zero-voltage line 212 to form a first hexagonal parallelogon pattern 210C (see also, hexagonal parallelogon pattern 210C-1 with power pins 206-C1, 206-C2 and hexagonal parallelogon pattern 210C-2 with power pins 206-C3, 206-C4). For a second differential pair 202-A, 202-B, which are positioned between two first differential pairs 202-1, 202-2 having the first hexagonal parallelogon pattern 210C-1, 210C-2, a second hexagonal parallelogon pattern 211C forms. The second hexagonal parallelogon pattern 211C forms based on the adjacent first hexagonal parallelogon patterns 210C-1, 210C-2, where the power pins 206-C2, 206-C3 are positioned adjacent to and diagonally above and below the zero-voltage line 212C of the second differential pair 202-A, 202-B. A grid array may repeat the first and second hexagonal parallelogon patterns (e.g., 210C, 211C) with adjacent first and second differential signal pairs 202 sharing the adjacent power pins 206 and ground pins 204. The hexagonal parallelogon pattern of FIG. 2C in its simplest form (as indicated by the dashed and dotted line 220C) has a signal/power pin to ground pin ratio equal to 6:6 or 1:1.

Figure 2D:
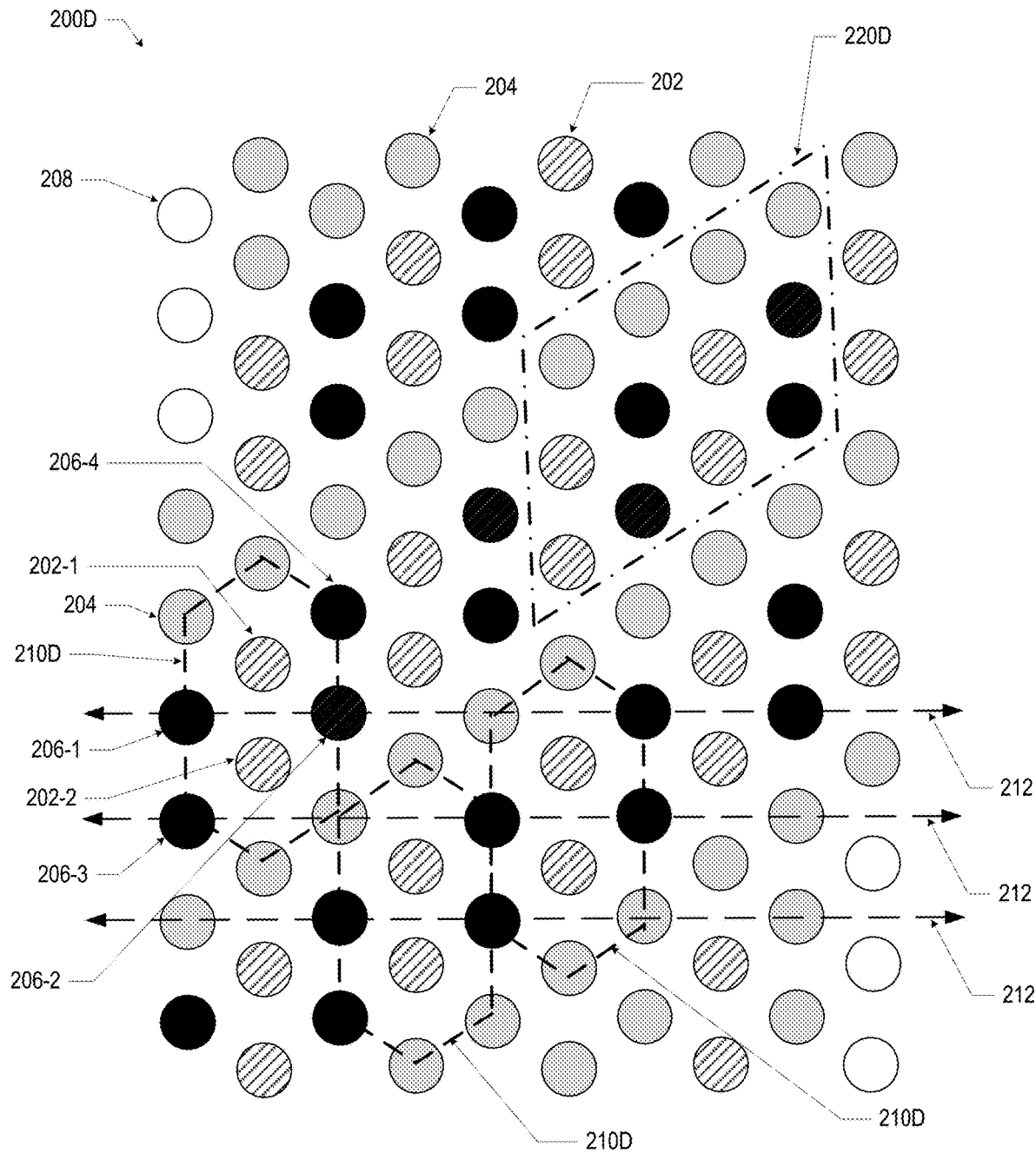
FIG. 2D is a top view of a portion of another exemplary hexagonal parallelogon pin field configuration including high speed differential pins and power pins, in accordance with various embodiments.

FIG. 2D is a top view of a portion of another exemplary hexagonal parallelogon pin field configuration, in accordance with various embodiments. The exemplary pin field configuration 200D includes a plurality of high speed differential pin pairs 202 (i.e., as indicated by the diagonally-striped circles), a plurality of ground pins 204 (i.e., as indicated by the light gray circles), and a plurality of power pins 206 (i.e., as indicated by the black circles) arranged in a hexagonal parallelogon pattern 210D (i.e., as indicated by the dotted line forming an elongated parallelogram). The differential pairs are arranged in an offset pattern, where the differential pairs align diagonally as in FIG. 2C. The high speed differential pin pair 202-1, 202-2 are positioned adjacent to each other and a zero-voltage line 212 is formed between the differential pin pair 202-1, 202-2. For clarity, not all zero-voltage lines 212 are depicted in FIG. 2D. A first power pin 206-1 and a second power pin 206-2 are positioned adjacent to the differential signal pins 202-1, 202-2, and opposite each other, at the zero-voltage line 212, a third power pin 206-3 is positioned directly below the first power pin 206-1, a fourth power pin 206-4 is positioned directly above the second power pin 206-2, and the ground pins 204 are positioned adjacent to the differential signal pins 202-1, 202-2 above and below the zero-voltage line 212 to form a first hexagonal parallelogon pattern 210D. A grid array may repeat the hexagonal parallelogon pattern 210D with adjacent differential signal pairs 202 sharing the adjacent power pins 206 and ground pins 204, in fact, the third and fourth power pins 206-3, 206-4 of the hexagonal parallelogon pattern 210D are power pins 206 positioned along the zero-voltage line 212 of adjacent differential signal pairs 202. The hexagonal parallelogon pattern of FIG. 2D in its simplest form (as indicated by the dashed and dotted line 220D) has a signal/power pin to ground pin ratio equal to 8:4 or 2:1.

Figure 3A:
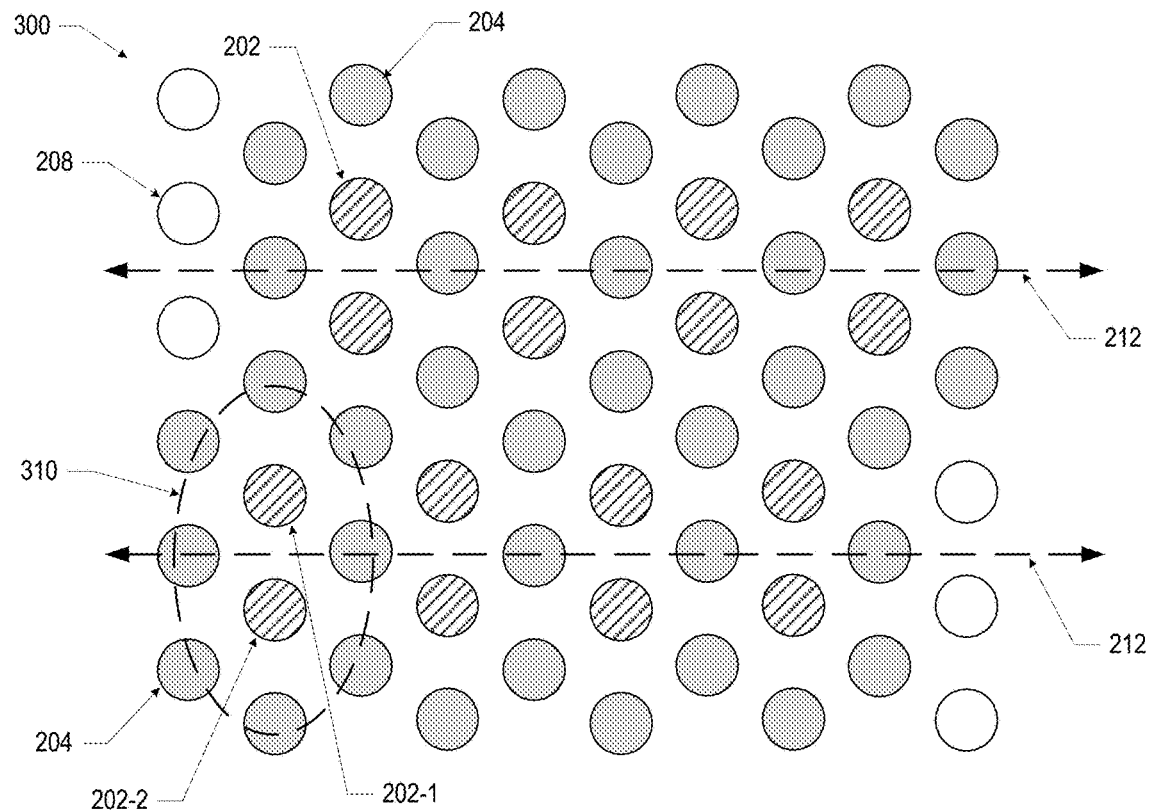
FIG. 3A is a top view of a portion of a conventional pin field configuration including high speed differential pins and ground pins.

FIG. 3A is a top view of a portion of a conventional pin field configuration including high speed differential pins and ground pins. The conventional pin field configuration 300 includes high speed differential pin pairs 202 (i.e., as indicated by the diagonally-striped circles) and ground pins 204 (i.e., as indicated by the light gray circles) arranged to surround (i.e., as indicated by the dotted line forming an oval 310) the differential pin pairs 302. Similar to FIG. 2, the high speed differential pin pair 202-1, 202-2 are positioned adjacent to each other and a zero-voltage line 212 is formed between the differential pin pair 202-1, 202-2. The conventional pin field configuration 300 may further include other interconnect pins 208, such as sideband pin, positioned along one or more edges. The conventional pin field configuration shown in FIG. 3A has a signal pin to ground pin ratio of 2:3.

As a result of the greater ability to fit more processing power in smaller packages, smaller computing devices have increased in popularity. Smartphones, tablets, ultrathin notebooks, and other user equipment have grown exponentially. As the processing power grows along with the number of devices in a computing system, the communication between sockets and other devices becomes more critical. In fact, interconnects have grown from more traditional multi-drop buses that primarily handled electrical communications to full blown interconnect architectures that facilitate fast communication. Further, as the demand for future high performance processors increases, demand grows for interconnect architectures capable of supporting the corresponding high data rates made available by next generation processors.

One interconnect fabric architecture for connecting high-speed components is the Peripheral Component Interconnect (PCI) Express (PCIe) architecture. A primary goal of PCIe is to enable components and devices from different vendors to inter-operate in an open architecture, spanning multiple market segments; Clients (Desktops and Mobile), Servers (Standard and Enterprise), and Embedded and Communication devices. PCIe is a high performance, general purpose I/O interconnect defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCIe take advantage of advances in point-to-point interconnects, Switch-based technology, and packetized protocol to deliver new levels of performance and features. Power Management, Quality Of Service (QoS), Hot-Plug/Hot-Swap support, Data Integrity, and Error Handling are among some of the advanced features supported by PCIe. As processing power increases, so does the number of interconnect pins and the real estate required to implement pinout arrangements of interconnect pins. The next generation architectures, for example, PCIe Gen5, CXL, and PCIe Gen6, are likely to use a conventional pinout arrangement.

The hexagonal parallelogon pinout arrangement shown in FIG. 2 reduces the number of ground pins required to isolate the differential signal pair pins and reduces the overall pinout area by allowing power pins, or miscellaneous pins, to be placed adjacent to the differential signal pins without degrading signal quality. For example, a PCIe X16 port having 64 differential signal pins (i.e., 32 differential signal pairs) requires 96 ground pins for the conventional pinout arrangement (i.e., as shown in FIG. 3) but only requires 64 ground pins for the hexagonal parallelogon pinout arrangement (i.e., as shown in FIG. 2). Based on a total signal/ground pinout count of 160, the hexagonal parallelogon arrangement saves 32 pin spaces such that 32 power pins may be included. A BGA is identified by the number of sockets or pins. For example, a BGA 324 has 324 pins and a BGA 468 has 468 pins. Although most BGAs have standardized form factors (i.e., a defined number of pins), some BGAs may have different form factor variants. Some BGAs may include a PCIe X16 port section in the array.

Figure 3B:
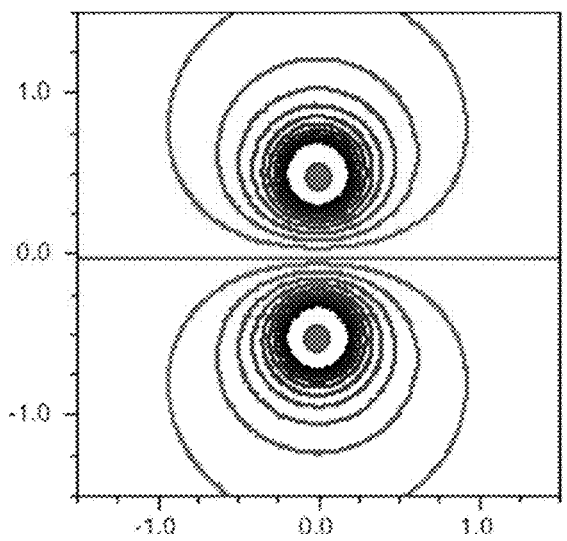
FIG. 3B illustrates a graph illustrating electrical fields generated by a pair of high speed differential pins arranged in the conventional pin field configuration of FIG. 3A.

FIG. 3B is a graph illustrating electrical fields generated by a pair of high speed differential pins arranged in the conventional pin field configuration of FIG. 3A. FIG. 3B illustrates simplified equipotential lines due to electric and magnetic fields of a differential signal pair of FIG. 3A for an electric field of a dipole. The horizontal line at 0.0 corresponds to the zero-voltage line or region due to the cancellation of the positive and negative field components.

Figure 3C:
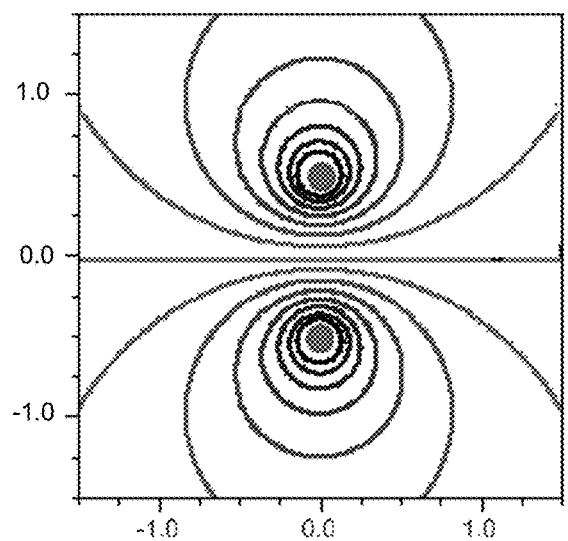
FIG. 3C illustrates a graph illustrating magnetic fields generated by a pair of high speed differential pins arranged in the conventional pin field configuration of FIG. 3A.

FIG. 3C is a graph illustrating magnetic fields generated by a pair of high speed differential pins arranged in the conventional pin field configuration of FIG. 3A. FIG. 3C illustrates simplified equipotential lines due to electric and magnetic fields of the differential signal pair of FIG. 3A for a magnetic field of an infinite wire. The horizontal line at 0.0 corresponds to the zero-voltage line or region due to the cancellation of the positive and negative field components.

Figure 4A:
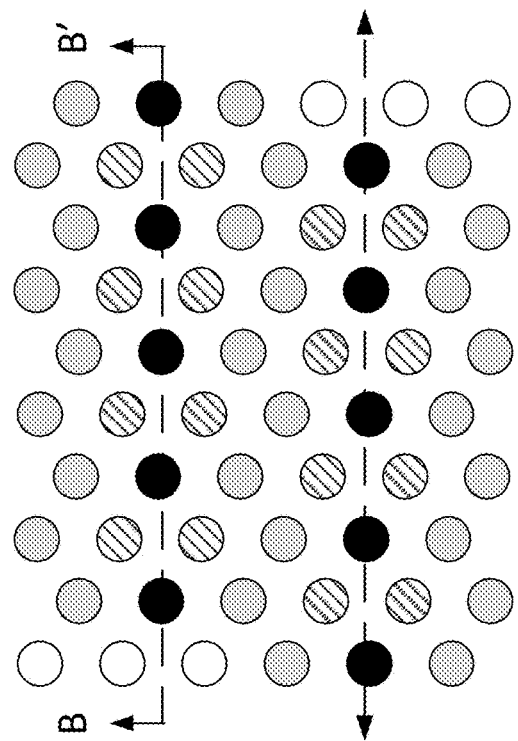
FIG. 4A a top view of a portion of a conventional pin field configuration including high speed differential pins and ground pins.

FIG. 4A a top view of a portion of a conventional pin field configuration on a circuit board. The conventional pin field configuration includes high speed differential pin pairs surrounded by ground pins. FIG. 4A depicts a cross section line A-A' at a zero-voltage line.

Figure 4B:
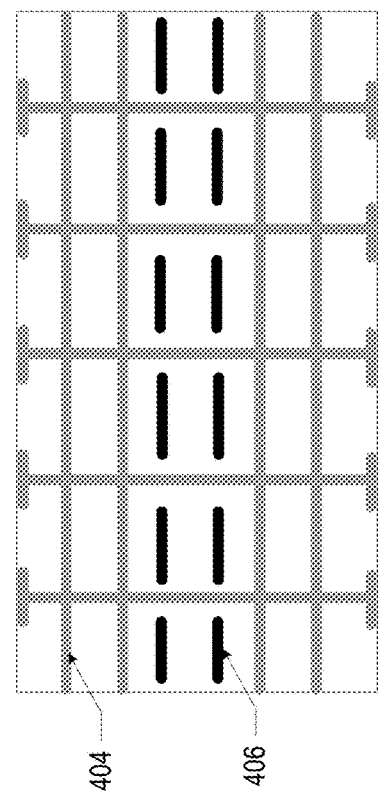
FIG. 4B is a side, cross-sectional view of a circuit board having the conventional pin field configuration of FIG. 4A along the A-A' line illustrating ground and power traces.

FIG. 4B is a side, cross-sectional view of a circuit board having the conventional pin field configuration of FIG. 4A along the A-A' line. FIG. 4B illustrates ground traces 404 and power traces 406 of the circuit board at the A-A' line, where the ground traces 404 predominate.

Figure 5A:
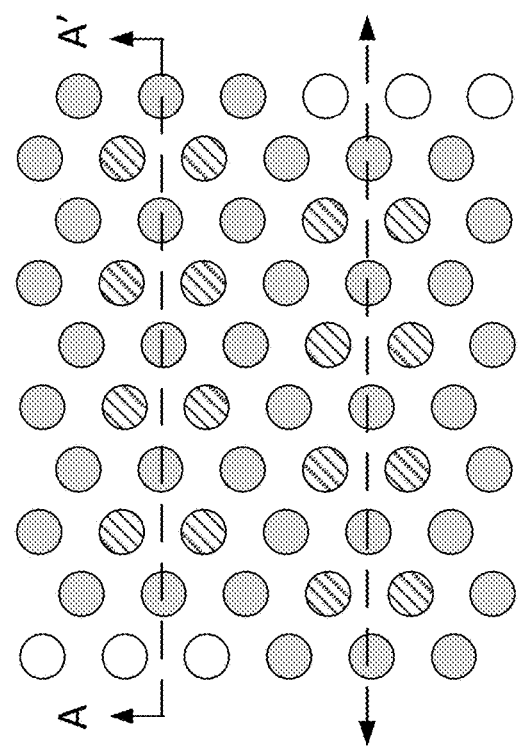
FIG. 5A is a top view of a portion of an exemplary pin field configuration including high speed differential pins and power pins, in accordance with various embodiments.

FIG. 5A is a top view of a portion of a hexagonal parallelogon pin field configuration on a circuit board, in accordance with various embodiments. The hexagonal parallelogon pin field configuration includes high speed differential pin pairs surrounded by ground pins above and below a zero-voltage line, and power pins position symmetrical to the differential signal pairs at the zero-voltage line. FIG. 5A depicts a cross section line B-B' at a zero-voltage line.

Figure 5B:
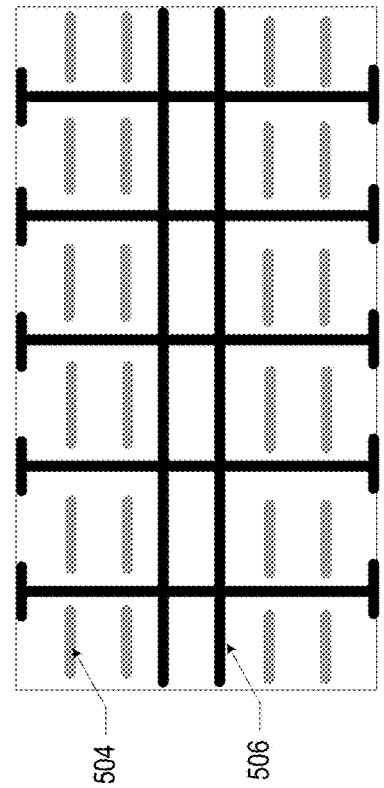
FIG. 5B is a side, cross-sectional view of a circuit board having the exemplary pin field configuration of FIG. 5A along the B-B' line illustrating ground and power traces, in accordance with various embodiments.

FIG. 5B is a side, cross-sectional view of a circuit board having the hexagonal parallelogon pin field configuration of FIG. 5A along the B-B' line. FIG. 5B illustrates ground traces 504 and power traces 506 of the circuit board at the B-B' line, where the power traces 506 predominate.

Figure 6:
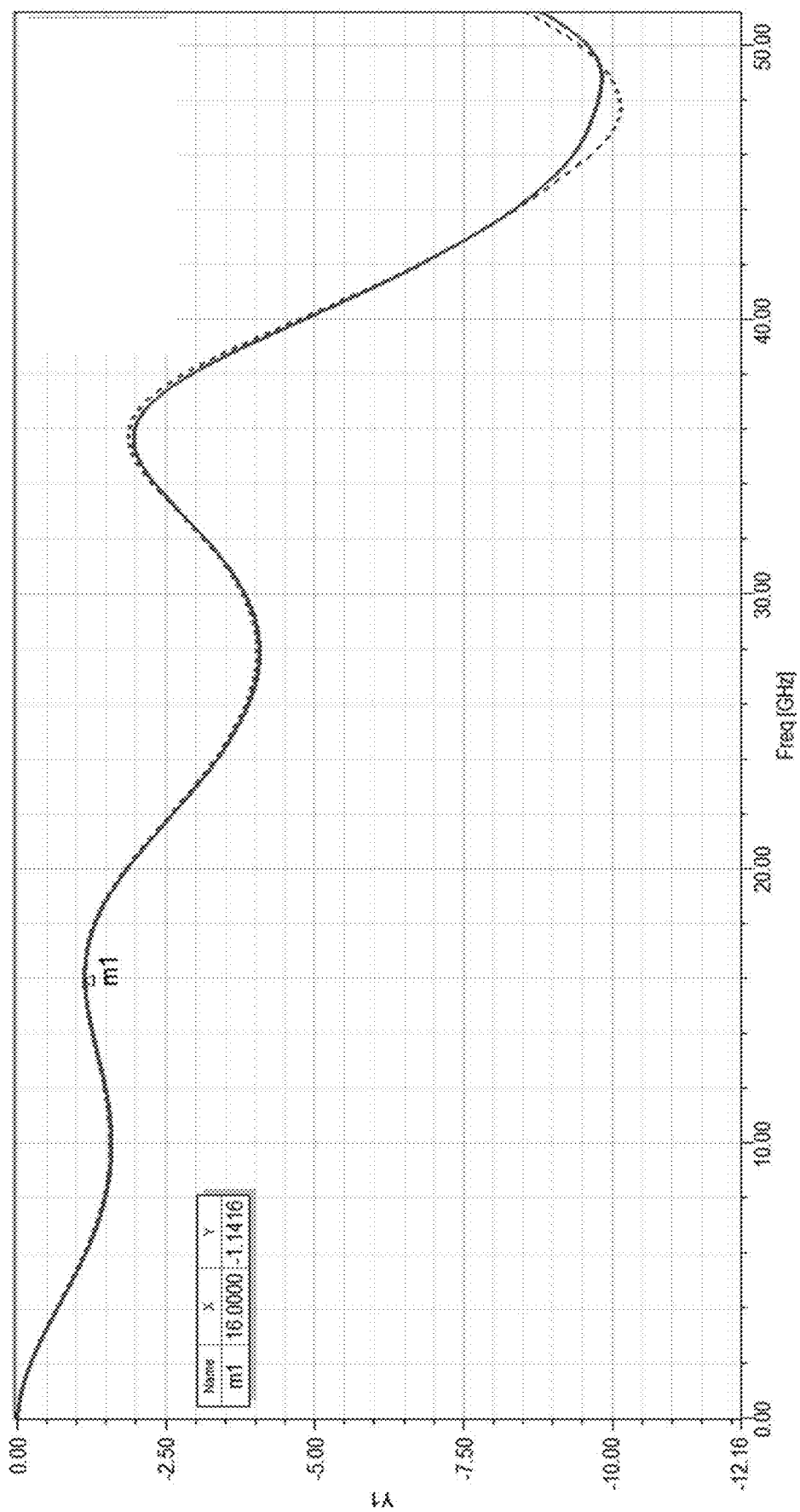
FIG. 6 is a simulation graph depicting S-parameter insertion loss of high speed differential signals of the conventional configuration of FIG. 4A versus the hexagonal parallelogon configuration of FIG. 5A, in accordance with various embodiments.

FIG. 6 is a simulation graph depicting S-parameter insertion loss of high speed differential signals of the conventional configuration of FIG. 4A versus the hexagonal parallelogon configuration of FIG. 5A, in accordance with various embodiments. S-parameters, also referred to as Scattering parameters, describe the electrical behavior of linear electrical networks when undergoing various steady state stimuli by electrical signals. A package BGA pinout having the conventional configuration of FIG. 4A and a package BGA pinout having the hexagonal parallelogon configuration of FIG. 5A were compared using a High Frequency Structure Simulator (HFSS), which simulates electromagnetic fields predictive of functionality. In FIG. 6, the solid line represents the S-parameter insertion loss of the high speed differential signal of the BGA pinout having the conventional configuration of FIG. 4A, and the dotted line represents the S-parameter insertion loss of the high speed differential signal of the BGA pinout having the hexagonal parallelogon configuration of FIG. 5A. As depicted in FIG. 6, the insertion loss performance of the BGA pinout having the hexagonal parallelogon configuration of FIG. 5A is almost the same (i.e., the difference is de minimis) as the BGA pinout having the conventional configuration of FIG. 4A.

Figure 7:
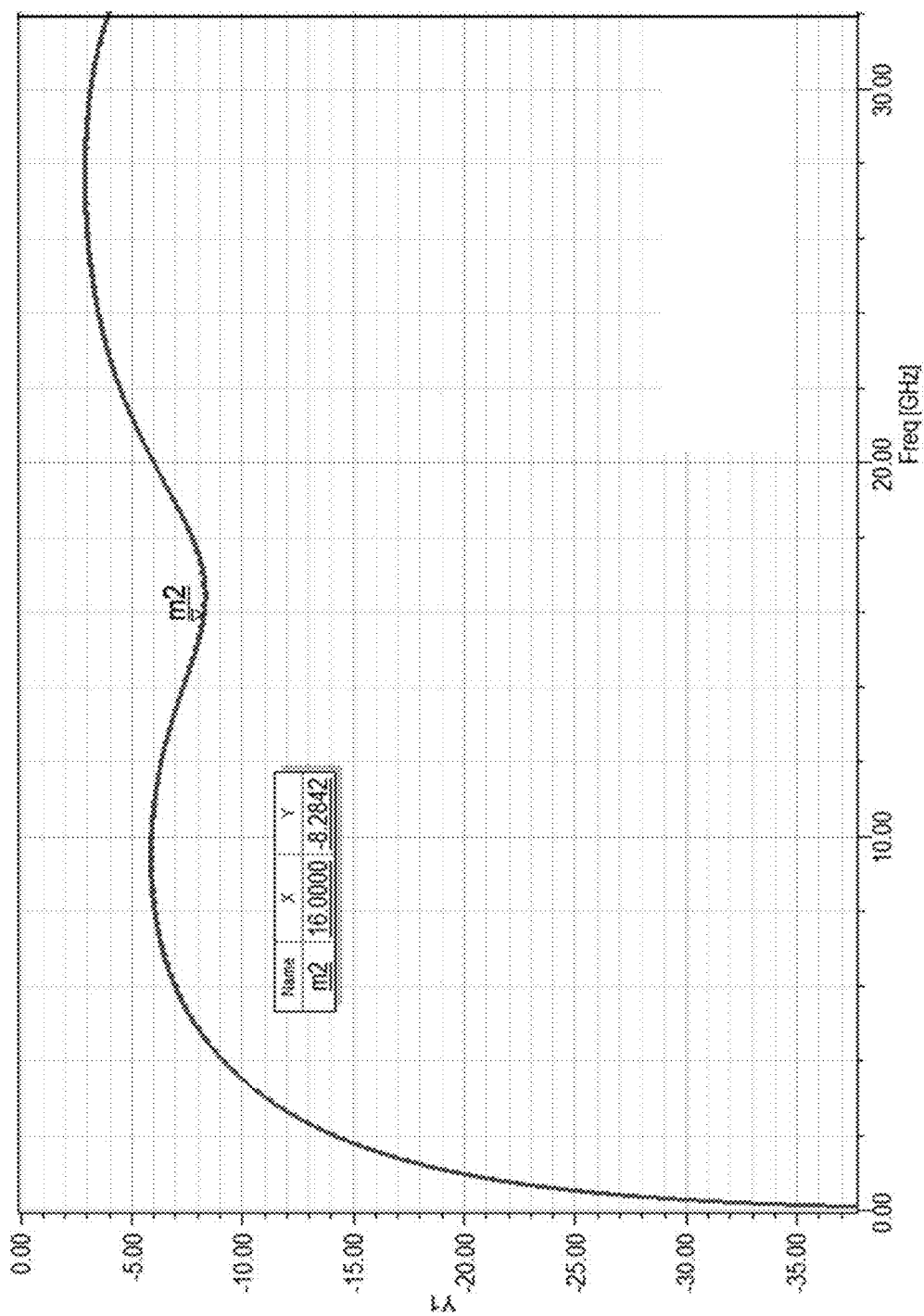
FIG. 7 is a simulation graph depicting S-parameter return loss of high speed differential signals of the conventional configuration of FIG. 4A versus the hexagonal parallelogon configuration of FIG. 5A, in accordance with various embodiments.

FIG. 7 is a simulation graph depicting S-parameter return loss of high speed differential signals of the conventional configuration of FIG. 4A versus the hexagonal parallelogon configuration of FIG. 5A, in accordance with various embodiments. A package BGA pinout having the conventional configuration of FIG. 4A and a package BGA pinout having the hexagonal parallelogon configuration of FIG. 5A were compared using an HFSS, which simulates electromagnetic fields predictive of functionality. In FIG. 7, the solid line represents the S-parameter return loss of the high speed differential signal of the BGA pinout having the conventional configuration of FIG. 4A, and the dotted line represents the S-parameter return loss of the high speed differential signal of the BGA pinout having the hexagonal parallelogon configuration of FIG. 5A. As depicted in FIG. 7, the insertion loss performance of the BGA pinout having the hexagonal parallelogon configuration of FIG. 5A is almost the same (i.e., the difference is de minimis) as the BGA pinout having the conventional configuration of FIG. 4A.

Figure 8:
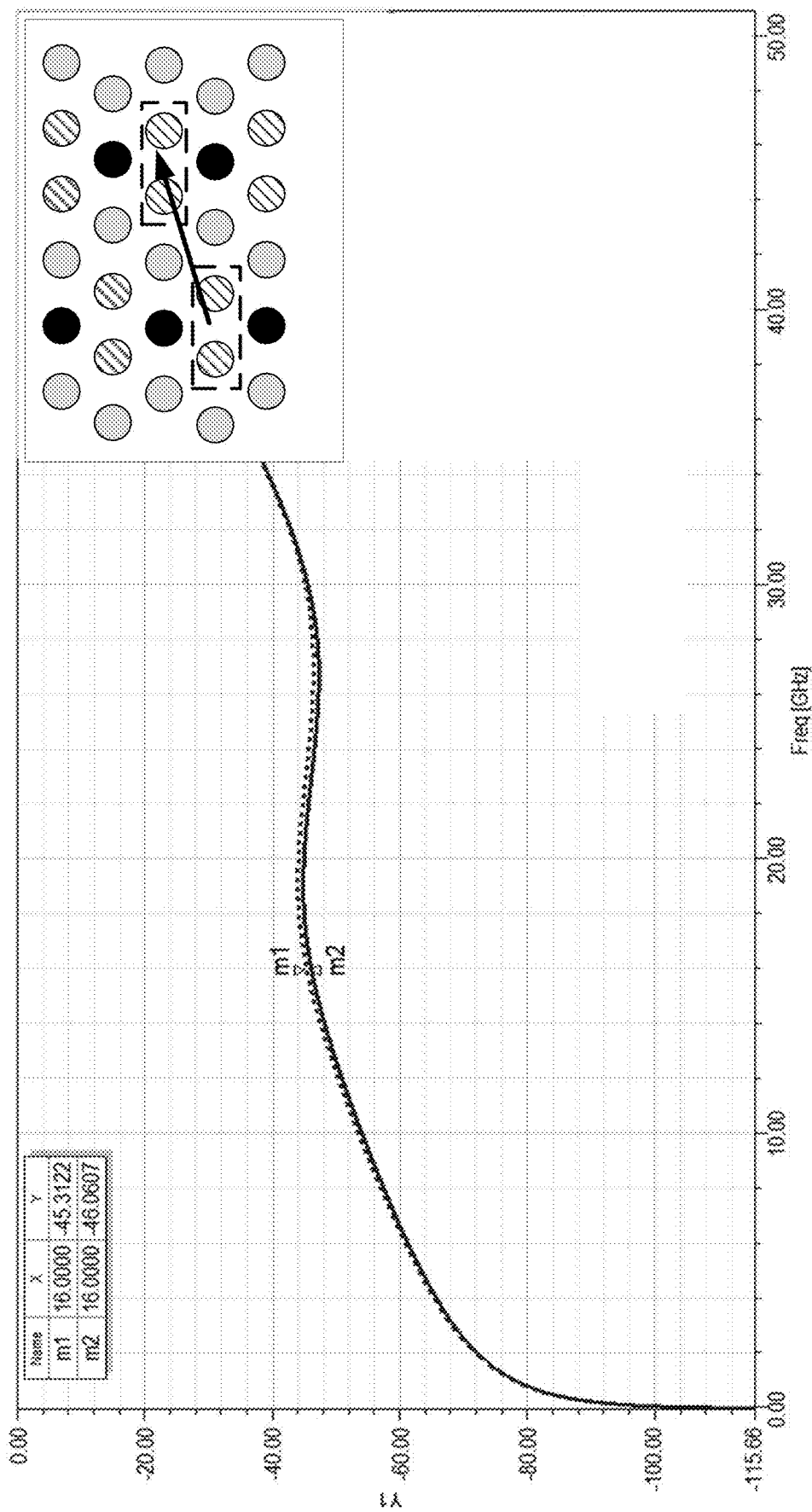
FIG. 8 is a simulation graph depicting near-end crosstalk characteristics of high speed differential signals of the conventional configuration of FIG. 4A versus the hexagonal parallelogon configuration of FIG. 5A, in accordance with various embodiments.

FIG. 8 is a simulation graph depicting near-end crosstalk characteristics of high speed differential signals of the conventional configuration of FIG. 4A versus the hexagonal parallelogon configuration of FIG. 5A, in accordance with various embodiments. A package BGA pinout having the conventional configuration of FIG. 4A and a package BGA pinout having the hexagonal parallelogon configuration of FIG. 5A were compared using an HFSS, which simulates electromagnetic fields predictive of functionality. In FIG. 8, the solid line represents the S-parameter near-end crosstalk of the high speed differential signals, where a first differential pair is transmitting and a second differential pair is receiving (as indicated by the arrow in the pinout configuration inset), of the BGA pinout having the conventional configuration of FIG. 4A, and the dotted line represents the S-parameter near-end crosstalk of the high speed differential signals, where a first differential pair is transmitting and a second differential pair is receiving, of the BGA pinout having the hexagonal parallelogon configuration of FIG. 5A. As depicted in FIG. 8, the near-end crosstalk performance of the BGA pinout having the hexagonal parallelogon configuration of FIG. 5A is almost the same (i.e., the difference is de minimis) as the BGA pinout having the conventional configuration of FIG. 4A.

Figure 9:
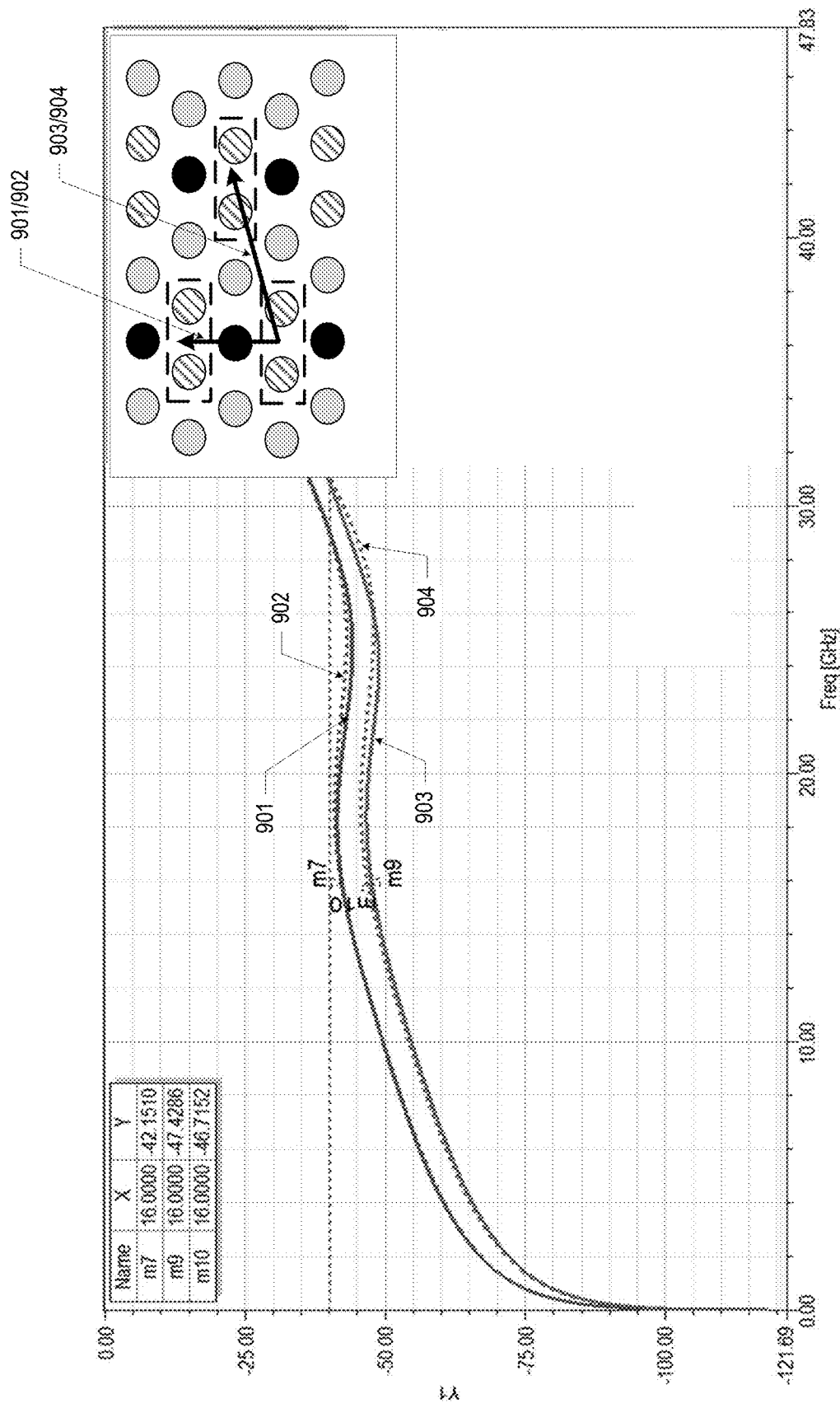
FIG. 9 is a simulation graph depicting far-end crosstalk characteristics of high speed differential signals of the conventional configuration of FIG. 4A versus the hexagonal parallelogon configuration of FIG. 5A, in accordance with various embodiments.

FIG. 9 is a simulation graph depicting far-end crosstalk characteristics of high speed differential signals in the conventional configuration of FIG. 4A versus the hexagonal parallelogon configuration of FIG. 5A, in accordance with various embodiments. A package BGA pinout having the conventional configuration of FIG. 4A and a package BGA pinout having the hexagonal parallelogon configuration of FIG. 5A were compared using an HFSS, which simulates electromagnetic fields predictive of functionality. In FIG. 9, the solid line 901 represents the S-parameter far-end crosstalk of the high speed differential signals, where all differential pairs are transmitting, of the BGA pinout having the conventional configuration of FIG. 4A, and the dotted line 902 represents the S-parameter far-end crosstalk of the high speed differential signals, where all differential pairs are transmitting (as indicated by the arrows in the pinout configuration inset), of the BGA pinout having the hexagonal parallelogon configuration of FIG. 5A. In FIG. 9, the solid line 903 represents the S-parameter far-end crosstalk of the high speed differential signals, where all differential pairs are receiving, of the BGA pinout having the conventional configuration of FIG. 4A, and the dotted line 904 represents the S-parameter far-end crosstalk of the high speed differential signals, where all differential pairs are receiving, of the BGA pinout having the hexagonal parallelogon configuration of FIG. 5A. As depicted in FIG. 9, the far-end crosstalk performance of the BGA pinout having the hexagonal parallelogon configuration of FIG. 5A is almost the same (i.e., the difference is de minimis) as the BGA pinout having the conventional configuration of FIG. 4A, in both scenarios, where all differential pairs are transmitting and where all differential pairs are receiving.

Figure 10:
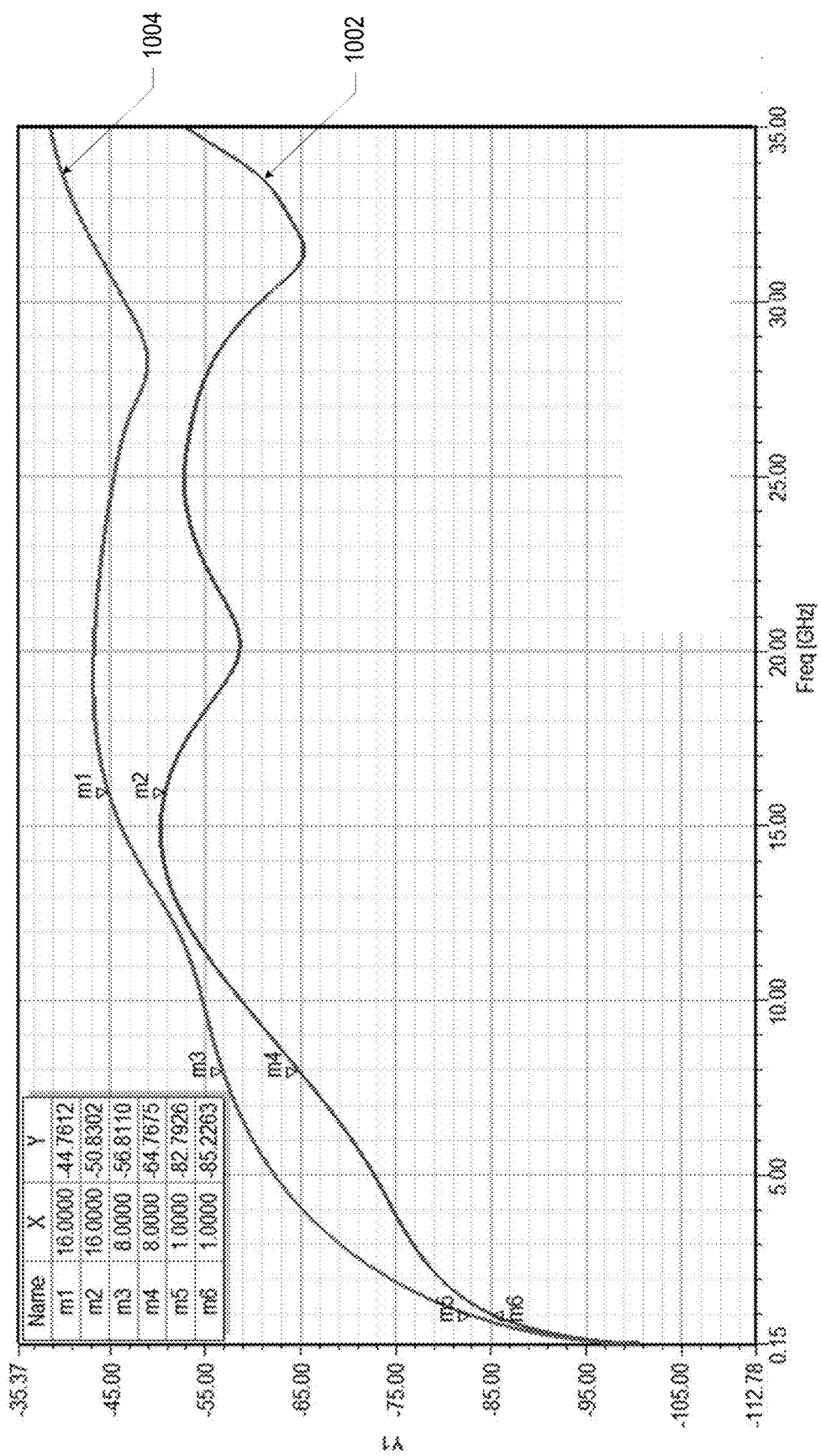
FIG. 10 is a simulation graph depicting near-end crosstalk and far-end crosstalk characteristics of high speed differential signals to an adjacent pin of the hexagonal parallelogon configuration of FIG. 5A, in accordance with various embodiments.

FIG. 10 is a simulation graph depicting near-end crosstalk and far-end crosstalk characteristics of high speed differential signals to an adjacent power pin in the hexagonal parallelogon configuration of FIG. 5A, in accordance with various embodiments. FIG. 10 illustrates near-end crosstalk 1002 and far-end crosstalk 1004 characteristics of high speed differential signals to an adjacent power pin of a package BGA pinout having the hexagonal parallelogon configuration of FIG. 5A using an HFSS, which simulates electromagnetic fields predictive of functionality. As shown in FIG. 10, the spectrum of high-speed differential signals may be 16 GHz or more, depending on the bus type, and may inject noise of about −40 decibels (dB). Most power pins are able to manage this amount of noise, and some miscellaneous pins are able to manage up to −20 dB of noise. As shown in FIG. 10, the power noise spectrum is below 1 Gigahertz (GHz) such that a power rail with a noise level of 500 millivolts (mV), would inject less than 50 microvolts (uV) of noise, which may be diminished by high-speed differential signal lane design. For miscellaneous signals, if a properly terminated (~50 ohms) and non-toggling type is selected, the effect of miscellaneous signal noise in high-speed differential signals will be practically zero.

FIGS. 11A-B are top views of a wafer 1101 and dies 1105 that may be included in an IC assembly (e.g., die 114) disclosed herein. The wafer 1101 may be composed of semiconductor material and may include one or more dies 1105 having IC elements formed on a surface of the wafer 1101. Each of the dies 1105 may be a repeating unit of a semiconductor product that includes any suitable IC. After the fabrication of the semiconductor product is complete, the wafer 1101 may undergo a singulation process in which each of the dies 1105 is separated from one another to provide discrete "chips" of the semiconductor product. The die 1105 may include one or more transistors (e.g., some of the transistors 1140 of FIG. 11C, discussed below) and/or supporting circuitry to route electrical signals to the transistors, as well as any other IC components. In some embodiments, the wafer 1101 or the die 1105 may include a memory device (e.g., a static random access memory (SRAM) device), a logic device (e.g., AND, OR, NAND, or NOR gate), or any other suitable circuit element. Multiple ones of these devices may be combined on a single die 1105. For example, a memory array formed by multiple memory devices may be formed on a same die 1105 as a processing device (e.g., the processing device 1202 of FIG. 12) or other logic that is configured to store information in the memory devices or execute instructions stored in the memory array. In some embodiments, the die 1105 may include circuitry that is to couple to and interact with circuitry provided by integral devices in the package substrate, after the die 1105 is coupled to the package substrate, as discussed above.

FIG. 11C is a cross-sectional side view of an IC device 1100 that may be included in a die that may be coupled to a package substrate. In particular, one or more of the IC devices 1100 may be included in one or more dies. The IC device 1100 may be formed on a substrate 1102 (e.g., the wafer 1101 of FIG. 11A) and may be included in a die (e.g., the die 1105 of FIG. 11B). The substrate 1102 may be a semiconductor substrate composed of semiconductor material systems including, for example, N-type or P-type materials systems. The substrate 1102 may include, for example, a crystalline substrate formed using a bulk silicon or a silicon-on-insulator substructure. In some embodiments, the substrate 1102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1102. Although a few examples of materials from which the substrate 1102 may be formed are described here, any material that may serve as a foundation for an IC device 1100 may be used. The substrate 1102 may be part of a singulated die (e.g., the dies 1105 of FIG. 11B) or a wafer (e.g., the wafer 1101 of FIG. 11A).

The IC device 1100 may include one or more device layers 1104 disposed on the substrate 1102. The device layer 1104 may include features of one or more transistors 1140 (e.g., metal oxide semiconductor field-effect transistors (MOSFETs)) formed on the substrate 1102. The device layer 1104 may include, for example, one or more source and/or drain (S/D) regions 1120, a gate 1122 to control current flow in the transistors 1140 between the S/D regions 1120, and one or more S/D contacts 1124 to route electrical signals to/from the S/D regions 1120. The transistors 1140 may include additional features not depicted for the sake of clarity, such as device isolation regions, gate contacts, and the like. The transistors 1140 are not limited to the type and configuration depicted in FIG. 11C and may include a wide variety of other types and configurations such as, for example, planar transistors, nonplanar transistors, or a combination of both. Nonplanar transistors may include FinFET transistors, such as double-gate transistors or tri-gate transistors, and wraparound or all-around gate transistors, such as nanoribbon and nanowire transistors.

Each transistor 1140 may include a gate 1122 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work-function metal or N-type work-function metal, depending on whether the transistor 1140 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross section of the transistor 1140 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1120 may be formed within the substrate 1102 adjacent to the gate 1122 of each transistor 1140. The S/D regions 1120 may be formed using either an implantation/diffusion process or an etching/deposition process, for example. In the former process, dopants such as boron, aluminum, antimony, phosphorous, or arsenic may be ion-implanted into the substrate 1102 to form the S/D regions 1120. An annealing process that activates the dopants and causes them to diffuse farther into the substrate 1102 may follow the ion-implantation process. In the latter process, the substrate 1102 may first be etched to form recesses at the locations of the S/D regions 1120. An epitaxial deposition process may then be carried out to fill the recesses with material that is used to fabricate the S/D regions 1120. In some implementations, the S/D regions 1120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1120 may be formed using one or more alternate semiconductor materials such as germanium or a group III-V material or alloy. In further embodiments, one or more layers of metal and/or metal alloys may be used to form the S/D regions 1120.

Electrical signals, such as power and/or input/output (I/O) signals, may be routed to and/or from the transistors 1140 of the device layer 1104 through one or more interconnect layers disposed on the device layer 1104 (illustrated in FIG. 11C as interconnect layers 1106-1110). For example, electrically conductive features of the device layer 1104 (e.g., the gate 1122 and the S/D contacts 1124) may be electrically coupled with the interconnect structures 1128 of the interconnect layers 1106-1110. The one or more interconnect layers 1106-1110 may form an interlayer dielectric (ILD) stack 1119 of the IC device 1100.

The interconnect structures 1128 may be arranged within the interconnect layers 1106-1110 to route electrical signals according to a wide variety of designs (in particular, the arrangement is not limited to the particular configuration of interconnect structures 1128 depicted in FIG. 11C). Although a particular number of interconnect layers 1106-1110 is depicted in FIG. 11C, embodiments of the present disclosure include IC devices having more or fewer interconnect layers than depicted.

In some embodiments, the interconnect structures 1128 may include trench structures 1128a (sometimes referred to as "lines") and/or via structures 1128b (sometimes referred to as "holes") filled with an electrically conductive material such as a metal. The trench structures 1128a may be arranged to route electrical signals in a direction of a plane that is substantially parallel with a surface of the substrate 1102 upon which the device layer 1104 is formed. For example, the trench structures 1128a may route electrical signals in a direction in and out of the page from the perspective of FIG. 11C. The via structures 1128b may be arranged to route electrical signals in a direction of a plane that is substantially perpendicular to the surface of the substrate 1102 upon which the device layer 1104 is formed. In some embodiments, the via structures 1128b may electrically couple trench structures 1128a of different interconnect layers 1106-1110 together.

The interconnect layers 1106-1110 may include a dielectric material 1126 disposed between the interconnect structures 1128, as shown in FIG. 11C. In some embodiments, the dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same.

A first interconnect layer 1106 (referred to as Metal 1 or "M1") may be formed directly on the device layer 1104. In some embodiments, the first interconnect layer 1106 may include trench structures 1128a and/or via structures 1128b, as shown. The trench structures 1128a of the first interconnect layer 1106 may be coupled with contacts (e.g., the S/D contacts 1124) of the device layer 1104.

A second interconnect layer 1108 (referred to as Metal 2 or "M2") may be formed directly on the first interconnect layer 1106. In some embodiments, the second interconnect layer 1108 may include via structures 1128b to couple the trench structures 1128a of the second interconnect layer 1108 with the trench structures 1128a of the first interconnect layer 1106. Although the trench structures 1128a and the via structures 1128b are structurally delineated with a line within each interconnect layer (e.g., within the second interconnect layer 1108) for the sake of clarity, the trench structures 1128a and the via structures 1128b may be structurally and/or materially contiguous (e.g., simultaneously filled during a dual-damascene process) in some embodiments.

A third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106.

The IC device 1100 may include a solder resist material 1134 (e.g., polyimide or similar material) and one or more bond pads 1136 formed on the interconnect layers 1106-1110. The bond pads 1136 may provide the contacts to couple to first level interconnects, for example. The bond pads 1136 may be electrically coupled with the interconnect structures 1128 and configured to route the electrical signals of the transistor(s) 1140 to other external devices. For example, solder bonds may be formed on the one or more bond pads 1136 to mechanically and/or electrically couple a chip including the IC device 1100 with another component (e.g., a circuit board). The IC device 1100 may have other alternative configurations to route the electrical signals from the interconnect layers 1106-1110 than depicted in other embodiments. For example, the bond pads 1136 may be replaced by or may further include other analogous features (e.g., posts) that route the electrical signals to external components.

Figure 12:
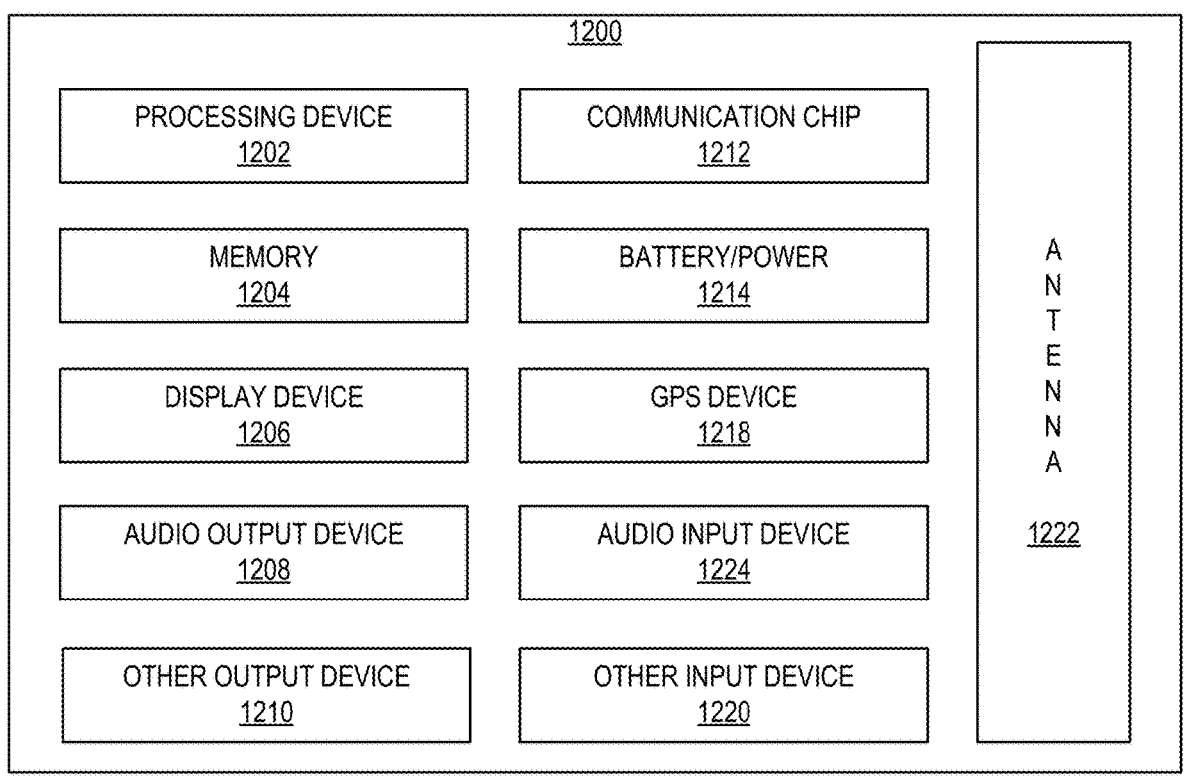
FIG. 12 is a block diagram of an example computing device that may include any of the embodiments of the electrical interconnects disclosed herein.

FIG. 12 is a block diagram of an example computing device 1200 that may include interconnects disclosed herein. For example, any suitable ones of the components of the computing device 1200 may include, or be included in, an IC assembly including a die having direct diagonal connections, in accordance with any of the embodiments disclosed herein. A number of components are illustrated in FIG. 12 as included in the computing device 1200, but any one or more of these components may be omitted or duplicated, as suitable for the application. In some embodiments, some or all of the components included in the computing device 1200 may be attached to one or more motherboards. In some embodiments, some or all of these components are fabricated onto a single system-on-a-chip (SoC) die.

Additionally, in various embodiments, the computing device 1200 may include interface circuitry for coupling to the one or more components. For example, the computing device 1200 may not include a display device 1206, but may include display device interface circuitry (e.g., a connector and driver circuitry) to which a display device 1206 may be coupled. In another set of examples, the computing device 1200 may not include an audio input device 1224 or an audio output device 1208, but may include audio input or output device interface circuitry (e.g., connectors and supporting circuitry) to which an audio input device 1224 or audio output device 1208 may be coupled.

The computing device 1200 may include a processing device 1202 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1202 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1200 may include a memory 1204, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1204 may include memory that shares a die with the processing device 1202. This memory may be used as cache memory and may include embedded dynamic random access memory (eDRAM) or spin transfer torque magnetic random-access memory (STT-MRAM).

In some embodiments, the computing device 1200 may include a communication chip 1212 (e.g., one or more communication chips). For example, the communication chip 1212 may be configured for managing wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1212 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1212 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1212 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1212 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1212 may operate in accordance with other wireless protocols in other embodiments. The computing device 1200 may include an antenna 1222 to facilitate wireless communications and/or to receive other wireless communications (such as AM or FM radio transmissions).

In some embodiments, the communication chip 1212 may manage wired communications, such as electrical, optical, or any other suitable communication protocols (e.g., the Ethernet). As noted above, the communication chip 1212 may include multiple communication chips. For instance, a first communication chip 1212 may be dedicated to shorter-range wireless communications such as Wi-Fi or Bluetooth, and a second communication chip 1212 may be dedicated to longer-range wireless communications such as GPS, EDGE, GPRS, CDMA, WiMAX, LTE, EV-DO, or others. In some embodiments, a first communication chip 1212 may be dedicated to wireless communications, and a second communication chip 1212 may be dedicated to wired communications.

The computing device 1200 may include battery/power circuitry 1214. The battery/power circuitry 1214 may include one or more energy storage devices (e.g., batteries or capacitors) and/or circuitry for coupling components of the computing device 1200 to an energy source separate from the computing device 1200 (e.g., AC line power).

The computing device 1200 may include a display device 1206 (or corresponding interface circuitry, as discussed above). The display device 1206 may include any visual indicators, such as a heads-up display, a computer monitor, a projector, a touchscreen display, a liquid crystal display (LCD), a light-emitting diode display, or a flat panel display, for example.

The computing device 1200 may include an audio output device 1208 (or corresponding interface circuitry, as discussed above). The audio output device 1208 may include any device that generates an audible indicator, such as speakers, headsets, or earbuds, for example.

The computing device 1200 may include an audio input device 1224 (or corresponding interface circuitry, as discussed above). The audio input device 1224 may include any device that generates a signal representative of a sound, such as microphones, microphone arrays, or digital instruments (e.g., instruments having a musical instrument digital interface (MIDI) output).

The computing device 1200 may include a global positioning system (GPS) device 1218 (or corresponding interface circuitry, as discussed above). The GPS device 1218 may be in communication with a satellite-based system and may receive a location of the computing device 1200, as known in the art.

The computing device 1200 may include an other output device 1210 (or corresponding interface circuitry, as discussed above). Examples of the other output device 1210 may include an audio codec, a video codec, a printer, a wired or wireless transmitter for providing information to other devices, or an additional storage device.

The computing device 1200 may include an other input device 1220 (or corresponding interface circuitry, as discussed above). Examples of the other input device 1220 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1200 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1200 may be any other electronic device that processes data.

The following examples pertain to further embodiments. The various features of the different embodiments may be variously combined with some features included and others excluded to suit a variety of different applications.

Example 1 is a microelectronic device having a hexagonal node configuration, including a differential signal node pair; a power node; and a plurality of ground nodes; and wherein the differential signal node pair, the power node, and the plurality of ground nodes are arranged in a hexagonal parallelogon pattern, wherein the differential signal node pair includes a first differential signal node adjacent to a second differential signal node, and wherein the power node is adjacent and symmetric to the differential signal node pair.

Example 2 may include the subject matter of Example 1, and may further specify that the differential signal node pair is one of a plurality of differential signal node pairs, and wherein the plurality of differential signal node pairs are arranged along a horizontal line.

Example 3 may include the subject matter of Examples 1 or 2, and may further specify that the differential signal node pair is one of a plurality of differential signal node pairs, and wherein a signal/power node to ground node ratio is 1:1.

Example 4 may include the subject matter of any of Examples 1-3, and may further specify that the power node is a first power node, and may further include a second power node, wherein the second power node is adjacent and symmetric to the differential signal node pair opposite the first power node.

Example 5 may include the subject matter of Example 4, and may further specify that the differential signal node pair is one of a plurality of differential signal node pairs, and wherein the plurality of differential signal node pairs are arranged along a horizontal line.

Example 6 may include the subject matter of Example 4, and may further specify that the differential signal node pair is one of a plurality of differential signal node pairs, and wherein a signal/power node to ground node ratio is 3:2.

Example 7 may include the subject matter of Example 4, and may further specify that the differential signal node pair is one of a plurality of differential signal node pairs, and wherein the plurality of differential signal node pairs are arranged along a 60 degree diagonal line.

Example 8 may include the subject matter of Example 4, and may further specify that the differential signal node pair is one of a plurality of differential signal node pairs, and wherein a signal/power node to ground node ratio is 1:1.

Example 9 may include the subject matter of Example 4, and may further include a third power node, wherein the third power node is adjacent to the first power node and the second differential signal node; and a fourth power node, wherein the fourth power node is adjacent to the second power node and the first differential signal node.

Example 10 may include the subject matter of Example 9, and may further specify that the differential signal node pair is one of a plurality of differential signal node pairs, and wherein the plurality of differential signal node pairs are arranged along a 60 degree diagonal line.

Example 11 may include the subject matter of Example 9, and may further specify that the differential signal node pair is one of a plurality of differential signal node pairs, and wherein a signal/power node to ground node ratio is 2:1.

Example 12 may include the subject matter of any of Examples 1-11, and may further specify that the first differential signal node is a positive node and the second differential signal node is a negative node.

Example 13 may include the subject matter of any of Examples 1-12, and may further specify that the power node is a digital power node.

Example 14 may include the subject matter of any of Examples 1-12, and may further specify that the power node is an analog power node.

Example 15 is a microelectronic assembly, including a microelectronic device having a plurality of first conductive contacts on a surface in a hexagonal node configuration, wherein at least a portion of the first conductive contacts include a differential signal pin pair, a miscellaneous pin, and a plurality of ground pins, and wherein the differential signal pin pair, the miscellaneous pin, and the plurality of ground pins are arranged in a hexagonal parallelogon pattern, and wherein the miscellaneous pin is adjacent and symmetric to the differential signal pin pair; a microelectronic substrate having a plurality of second conductive contacts on a surface; and a plurality of interconnects, wherein an individual interconnect of the plurality of interconnects electrically couples an individual first conductive contact on the surface of the microelectronic device to an individual second conductive contact on the surface of the microelectronic substrate.

Example 16 may include the subject matter of Example 15, and may further specify that the miscellaneous pin is a reset signal pin, a security signal pin, a chip selection pin, a flag signal pin, or a platform state indicator pin.

Example 17 may include the subject matter of Examples 15 or 16, and may further specify that the miscellaneous pin is a first miscellaneous pin, and may further include a second miscellaneous pin, wherein the second miscellaneous pin is adjacent and symmetric to the differential signal pin pair opposite the first miscellaneous pin.

Example 18 may include the subject matter of any of Examples 15-17, and may further specify that the plurality of interconnects are included in a ball grid array package.

Example 19 may include the subject matter of any of Examples 15-17, and may further specify that the plurality of interconnects are included in a pogo pin grid array socket.

Example 20 may include the subject matter of any of Examples 15-17, and may further specify that the plurality of interconnects are included in a land grid array socket.

Example 21 is a hexagonal node configuration, including a differential signal node pair; a power node; and a plurality of ground nodes; and wherein the differential signal node pair, the power node, and the plurality of ground nodes are arranged in a hexagonal parallelogon pattern with the power node positioned adjacent to the differential signal node pair along a zero-voltage line.

Example 22 is a computing device, including a microelectronic device having a plurality of first conductive contacts on a surface in a hexagonal node configuration, wherein at least a portion of the first conductive contacts include a differential signal pin pair, a miscellaneous pin, and a plurality of ground pins, and wherein the differential signal pin pair, the miscellaneous pin, and the plurality of ground pins are arranged in a hexagonal parallelogon pattern, and wherein the miscellaneous pin is adjacent and symmetric to the differential signal pin pair; a circuit board having a plurality of second conductive contacts on a surface; and a plurality of interconnects, wherein an individual interconnect of the plurality of interconnects electrically couples an individual first conductive contact on the surface of the microelectronic device to an individual second conductive contact on the surface of the circuit board.

Example 23 may include the subject matter of Example 22, and may further specify that the computing device is a server.

Example 24 may include the subject matter of Example 22, and may further specify that the computing device is a portable computing device.

Example 25 may include the subject matter of Example 22, and may further specify that the computing device is a wearable computing device.

Example 26 may include the subject matter of Example 22, and may further specify that the circuit board is a printed circuit board.

The invention claimed is:

1. A microelectronic device having a hexagonal node configuration, comprising:
   a differential signal node pair;
   a miscellaneous node;
   a power node; and
   a plurality of ground nodes; and
   wherein the differential signal node pair, the miscellaneous node, the power node, and the plurality of ground nodes are arranged in a hexagonal parallelogon pattern, wherein the differential signal node pair includes a first differential signal node adjacent to a second differential signal node, wherein the power node is adjacent and symmetric to the differential signal node pair, and wherein the miscellaneous node is adjacent and symmetric to the differential signal node pair.

2. The microelectronic device of claim 1, wherein the differential signal node pair is one of a plurality of differential signal node pairs, and wherein the plurality of differential signal node pairs are arranged along a horizontal line.

3. The microelectronic device of claim 1, wherein the differential signal node pair is one of a plurality of differential signal node pairs, and wherein a ratio of a number of signal/power nodes to a number of ground nodes in the hexagonal parallelogon pattern is 1:1.

4. The microelectronic device of claim 1, wherein the first differential signal node is a positive node and the second differential signal node is a negative node.

5. The microelectronic device of claim 1, wherein the power node is a digital power node.

6. The microelectronic device of claim 1, wherein the power node is an analog power node.

7. The microelectronic device of claim 1, wherein the power node is a first power node, and further comprising:
   a second power node, wherein the second power node is adjacent and symmetric to the differential signal node pair opposite the first power node.

8. The microelectronic device of claim 7, wherein the differential signal node pair is one of a plurality of differential signal node pairs, and wherein the plurality of differential signal node pairs are arranged along a horizontal line.

9. The microelectronic device of claim 7, wherein the differential signal node pair is one of a plurality of differential signal node pairs, and wherein a ratio of a number of signal/power nodes to a number of ground nodes in the hexagonal parallelogon pattern is 3:2.

10. The microelectronic device of claim 7, wherein the differential signal node pair is one of a plurality of differential signal node pairs, and wherein the plurality of differential signal node pairs are arranged along a 60 degree diagonal line.

11. The microelectronic device of claim 7, wherein the differential signal node pair is one of a plurality of differential signal node pairs, and wherein a ratio of a number of signal/power nodes to a number of ground nodes in the hexagonal parallelogon pattern is 1:1.

12. The microelectronic device of claim 7, and further comprising:
   a third power node, wherein the third power node is adjacent to the first power node and the second differential signal node; and
   a fourth power node, wherein the fourth power node is adjacent to the second power node and the first differential signal node.

13. The microelectronic device of claim 12, wherein the differential signal node pair is one of a plurality of differential signal node pairs, and wherein the plurality of differential signal node pairs are arranged along a 60 degree diagonal line.

14. The microelectronic device of claim 12, wherein the differential signal node pair is one of a plurality of differential signal node pairs, and wherein a ratio of a number of signal/power nodes to a number of ground nodes in the hexagonal parallelogon pattern is 2:1.

15. A microelectronic assembly, comprising:
   a microelectronic device having a plurality of first conductive contacts on a surface in a hexagonal node configuration, wherein at least a portion of the first conductive contacts include:
      a differential signal pin pair,
      a miscellaneous pin, and
      a plurality of ground pins, and
      wherein the differential signal pin pair, the miscellaneous pin, and the plurality of ground pins are arranged in a hexagonal parallelogon pattern, and wherein the miscellaneous pin is adjacent and symmetric to the differential signal pin pair;
   a microelectronic substrate having a plurality of second conductive contacts on a surface; and
   a plurality of interconnects, wherein an individual interconnect of the plurality of interconnects electrically couples an individual first conductive contact on the surface of the microelectronic device to an individual second conductive contact on the surface of the microelectronic substrate.

16. The microelectronic assembly of claim 15, wherein the miscellaneous pin is a reset signal pin, a security signal pin, a chip selection pin, a flag signal pin, or a platform state indicator pin.

17. The microelectronic assembly of claim 15, wherein the miscellaneous pin is a first miscellaneous pin, and further comprising:
   a second miscellaneous pin, wherein the second miscellaneous pin is adjacent and symmetric to the differential signal pin pair opposite the first miscellaneous pin.

18. The microelectronic assembly of claim 15, wherein the plurality of interconnects are included in a ball grid array package.

19. The microelectronic assembly of claim 15, wherein the plurality of interconnects are included in a pogo pin grid array socket.

20. The microelectronic assembly of claim 15, wherein the plurality of interconnects are included in a land grid array socket.

* * * * *